(12) United States Patent
Oon et al.

(10) Patent No.: US 8,237,188 B2
(45) Date of Patent: Aug. 7, 2012

(54) LIGHT SOURCE

(75) Inventors: Siang Ling Oon, Bukit Mertajam (MY); Chin Nyap Tan, Sungai Jawi (MY); Kee Yean Ng, Prai (MY)

(73) Assignee: Avego Technologies ECBU IP (Singapore) Pte. Ltd., Singapore (SG)

( * ) Notice: Subject to any disclaimer, the term of this patent is extended or adjusted under 35 U.S.C. 154(b) by 135 days.

(21) Appl. No.: 12/784,095

(22) Filed: May 20, 2010

(65) Prior Publication Data

US 2011/0089463 A1    Apr. 21, 2011

Related U.S. Application Data

(63) Continuation of application No. 12/581,755, filed on Oct. 19, 2009, now Pat. No. 8,089,086.

(51) Int. Cl.
*H01L 33/08* (2010.01)
*F21V 29/00* (2006.01)

(52) U.S. Cl. ........... 257/99; 257/E33.001; 257/E33.056; 362/294

(58) Field of Classification Search ............ 257/99, 257/79, E33.055, E33.056, 88, 707, 686; 362/310, 257, 84

See application file for complete search history.

(56) References Cited

U.S. PATENT DOCUMENTS

| | | | | |
|---|---|---|---|---|
| 5,857,767 | A  * | 1/1999  | Hochstein | ............... 362/373 |
| 5,998,925 | A  * | 12/1999 | Shimizu et al. | .......... 313/503 |
| 6,501,103 | B1   | 12/2002 | Jory et al. | |
| 7,514,718 | B2   | 4/2009  | Shin et al. | |
| 2002/0175621 | A1 * | 11/2002 | Song et al. | ............... 313/515 |
| 2006/0138645 | A1 * | 6/2006  | Ng et al. | ................... 257/707 |
| 2006/0244118 | A1   | 11/2006 | Roberts et al. | |
| 2008/0179618 | A1   | 7/2008  | Cheng | |

FOREIGN PATENT DOCUMENTS

| | | |
|---|---|---|
| WO | WO-2007/058438 | 5/2007 |
| WO | WO-2009/060219 | 5/2009 |

* cited by examiner

*Primary Examiner* — A. Sefer
*Assistant Examiner* — Nikolay Yushin

(57) ABSTRACT

Light sources are disclosed herein. One embodiment comprises a substrate having a first surface and a second surface located opposite the first surface. At least one first electrically conductive layer is affixed to the first surface of the substrate and partially covering the first surface of the substrate. At least one second electrically conductive layer is affixed to the first surface of the substrate and partially covering the first surface of the substrate. A light emitter is affixed to the first surface of the substrate in an area not covered by either of the at least one first electrically conductive layer or the at least one second electrically conductive layer. The substrate may be thinner in the area where the light emitter is affixed than in the areas where the first and second electrically conductive layers are affixed. A heat sink may be attached to the second surface of the substrate.

20 Claims, 1 Drawing Sheet

LIGHT SOURCE

This application is a continuation of prior U.S. patent application Ser. No. 12/581,755 of Siang Ling Oon, et al., filed Oct. 19, 2009, now U.S. Pat. No. 8,089,086 which is hereby incorporated by reference for all that it discloses.

BACKGROUND

Some light sources use a light emitting device such as a light emitting diode (LED) or similar device to generate light. The LED may be located on a substrate that protects the LED and provides a mechanism to provide power to the LED. During generation of light, the LED and, thus, the light source, generate heat. Light sources are becoming smaller and emitting more intense light, which causes them to generate more heat in a smaller volume.

The LED is connected to two electrodes associated with a substrate. Conventional light sources mount an LED with a bottom terminal to an electrically conductive layer or trace. This trace, which provides one of the two electrodes, is formed on the surface of the substrate. Mounting the LED on the trace electrically connects its bottom terminal to the trace. The other terminal of the LED is typically connected to the other electrode by a wire. Heat is transferred from the LED to the substrate through the trace on which the LED is mounted.

SUMMARY

Light sources are disclosed herein. One embodiment of a light source comprises a substrate having a first surface and a second surface located opposite the first surface. At least one first electrically conductive layer is affixed to the first surface of the substrate and partially covers the first surface of the substrate. At least one second electrically conductive layer is affixed to the first surface of the substrate and partially covers the first surface of the substrate. A light emitter is affixed to the first surface of the substrate in an area not covered by either of the at least one first electrically conductive layer or the at least one second electrically conductive layer. The substrate may be thinner in the area where the light emitter is affixed than in the areas where the first and second electrically conductive layers are affixed. A heat sink may be attached to the second surface of the substrate.

DETAILED DESCRIPTION

Figure 1:
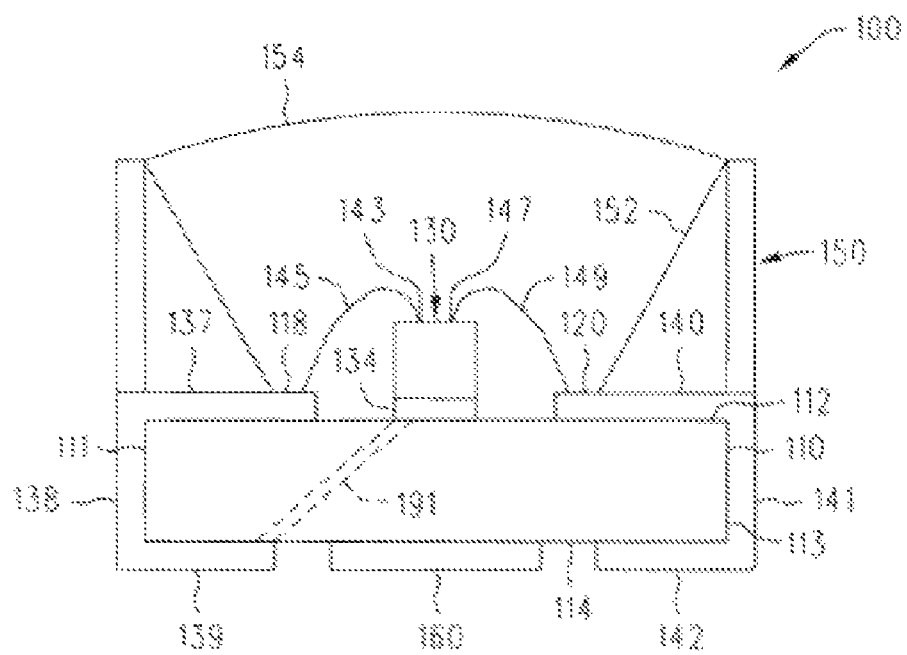
FIG. 1 is a side cut away view of an embodiment of a light source.

One embodiment of a light source is shown in FIG. 1. The light source 100 includes a substrate 110 that has a first or "top" surface 112 and a second or "bottom" surface 114 located opposite the first surface 112. Surfaces 112 and 114 may each be continuous, flat surfaces. The substrate 110 may be a ceramic substrate or may comprise ceramic. Ceramic substrates provide good thermal characteristics for dissipating heat from heat generating components attached to the substrate. In addition, ceramic substrates provide good electrical isolation when used as circuit boards. One of the problems with ceramic substrates is that they are brittle and tend to break easily. This problem is alleviated by at least one of the light source embodiments described herein. It is noted that the substrate 110 may include materials other than ceramic. For example, the substrate 110 may be made from silicon or other materials. As will be clear from the description and drawings, "substrate" as used herein in reference to a component of a light source, refers to the primary body or base which provides structural support for other components of the light source.

In some embodiments of the light source 100, electrically conductive layers/electrodes are located on the first surface 112 of the substrate 110. The light source 100 of FIG. 1 has two electrically conductive layers, which are referred to herein as a first electrically conductive layer/electrode 118 and a second electrically conductive layer/electrode 120. The electrically conductive layers 118, 120 may be electrical traces which may be provided by conventional processes. As described below, the electrically conductive layers 118, 120 do not cover the entire first surface 112 of the substrate 110.

A light emitter 130 is affixed to the first surface 112 of the substrate 110. It is noted that the light emitter 130 is affixed directly to the first surface 112 of the substrate 110 and not to either of the electrically conductive layers 118, 120. An adhesive layer 134 which is a good heat conductor, for example, silver epoxy, may be used to affix the light emitter 130 to the first surface 112 of the substrate 110. Thus, there is no intermediate metal layer between the light emitter and the surface of the substrate to which it is attached. Silver epoxy is a thermoset material, as is known in the art. The light emitter 130 may be a light-emitting diode (LED).

Affixing the light emitter 130 directly to the first surface 112 of the substrate 110 provides several benefits over conventional light sources. One benefit is that the direct adhesion of the light emitter 130 to the substrate 110 provides a stronger bond than when the light emitter is adhered to a trace. To provide one specific and non-limiting example, adhesion of light emitter 130 to a ceramic substrate 110 with an adhesive such as silver epoxy is stronger than a conventional connection such as provided by using silver epoxy to attach the light emitter 130 to an electrically conductive layer/trace, such as a silver layer. Thus, the light emitter 130 is less likely to delaminate from the substrate 110 using the herein described direct attachment than when the light source is attached to a trace according to conventional attachment methods. Another benefit of this type of attachment is that heat generated by the light emitter 130 is conducted through the adhesive layer 134 to the substrate 110. When a light emitter is affixed to an intermediate electrically conductive layer, heat must pass from the light emitter through the attachment material and then through the electrically conductive layer before it is transferred to the substrate. Thus, with a conventional construction, heat is caused to pass through an additional layer of material before it reaches the substrate as compared to the below described constructions of FIGS. 1 and 2. The below described light sources of FIGS. 1 and 2 have eliminated one of the layers of material used in conventional constructions and thus substantially improve heat transfer to a substrate over that of conventional constructions.

The electrically conductive layers 118, 120 may have portions associated with the different surface portions of the substrate 110. A top portion 137 of the conductive layer 118 may extend along the first/top surface 112 of the substrate and a top portion 140 of the conductive layer 120 may also extend along the first/top surface 112. A side portion 138 of the first electrically conductive layer 118 may extend along a side surface 111 of the substrate 110. A side portion 141 of the second conductive layer 120 may extend along a side surface 113 of the substrate 110. A bottom portion 139 of the first conductive layer 118 may extend along the second/bottom surface 114 of the substrate. A bottom portion 142 of the second conductive layer 120 may extend along the second/bottom surface 114. The side portions 138, 141, or bottom portions 139, 142 may be used, in some embodiments, to enable electric power, as supplied from a conventional power source (not shown) to be connected to the light emitter 130.

In the embodiment of FIG. 1, the first conductive layer/electrode 118 may be electrically connected to a first terminal 143 of the light emitter 130 by wire 145 as may be attached thereto by conventional wire boding. The second conductive layer/electrode 120 may be electrically connected to a second terminal 147 of the light emitter 130 by wire 149. In another embodiment such as shown in dashed lines in FIG. 1, one of the light emitter terminals may be positioned at a bottom portion of the light emitter 130 and may be electrically connected to a bottom portion of one electrode, e.g. 139 of a conductor layer 118, such as by a metal plated via, e.g. 191. Thus, the electrical connection provided by via 191 would serve as an alternative to the connection between terminal 143 and electrode portion 137 provided by wire 145. In this alternative embodiment, adhesive 134 may be an electrically conductive adhesive, such as silver epoxy, which conducts electricity between the terminal at the bottom of the light emitter 130 and via 191.

The light source 100 may have a reflector cup 150 attached to the substrate 110. The reflector cup 150 may have a reflective wall 152 which reflects a portion of the light generated by the light emitter 130 in a desired direction. The reflector cup 150 may be filled with an encapsulant 154 that serves to protect the components of the light source. The encapsulant may contain phosphor or other particles that change the color of light emitted by the light emitter 130. Therefore, light emitted by the light source 100 may differ from light emitted by the light emitter 130. The encapsulant 154 may act as a lens, as is known in the art. In some embodiments, the light source 100 does not have a reflector cup 150. In such embodiments an encapsulation layer may be applied to the top of the substrate 110 to cover the light emitter 130 and the associated parts.

A heat sink 160 may be attached to the substrate 110 proximate the light emitter 130. The heat sink 160 may have a thermal conductivity that is equal to or higher than the substrate 110. In the embodiment of FIG. 1, the heat sink 160 is attached to the second/bottom surface 114 of the substrate 110. Heat from light emitter 130 passes through attachment layer 134 and substrate 110 to the heat sink 160. Heat sink 160 radiates heat into the surrounding atmosphere/environment. (The use of a heat sink to dissipate heat from a substrate is known in the art) Again, the light emitter 130 is attached directly to the first surface 112 of the substrate 110 by adhesive layer 134. Therefore, heat generated by the light emitter 130 is conducted through adhesive layer 134 to substrate 110 and then to the heat sink 160 without passing through any additional metal layer, such as a trace, that would impede the heat transfer.

Terms such as "top," "bottom," and "side" which are used to describe different portions of the substrate 110 and other components have been used to facilitate explanation of the light source, but do not imply any particular orientation with respect to the field of gravity. "Top" was arbitrarily chosen to indicate the side of the substrate 110 on which the light emitter 130 is mounted. "Thickness" of a substrate portion refers to the distance between the associated top and bottom surfaces of that portion. This convention also applies to the description of FIG. 2.

Figure 2:
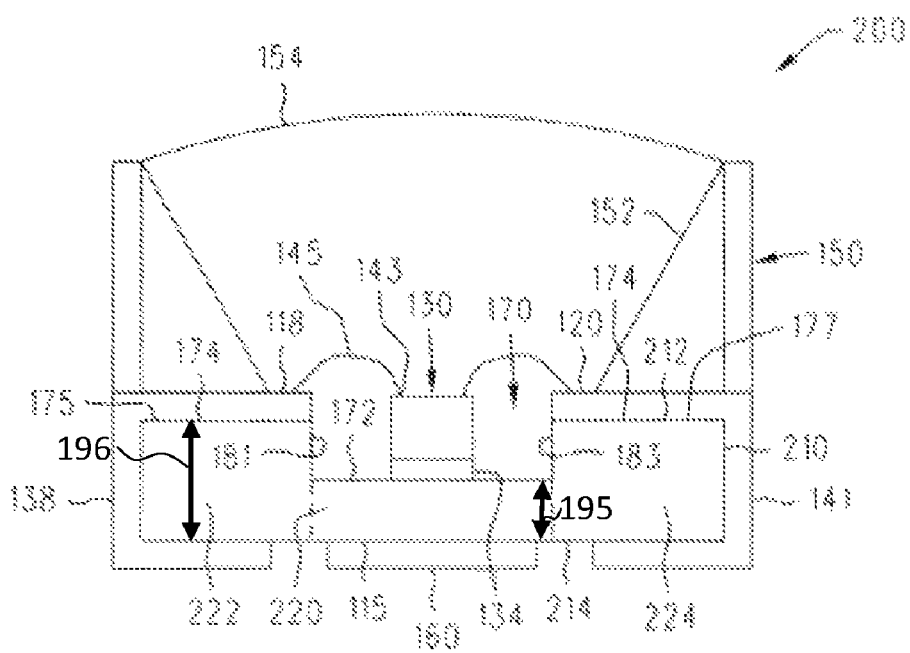
FIG. 2 is a side cut away view of another embodiment of a light source.

Another embodiment of a light source 200 is shown in FIG. 2. Features of the light source 200 which may correspond to features of FIG. 1 are given the same reference numerals as used in FIG. 1 and are not described in detail again. As further explained below, the substrate 210 of the light source 200 has a recessed area 170 in which the light emitter 130 is mounted. The substrate 210 is relatively thinner in the proximity of the light emitter 130, due to recessed area 170, and is relatively thicker in other portions of the substrate 210. The reduction in thickness of the substrate 210 below the recessed area 170 provides a corresponding reduction in thermal resistance in this region of the substrate that is located between the light emitter 130 and the heat sink 160. Thus, improved cooling of the light emitter 130 is provided by the reduced thickness.

A first/top surface 212 of the substrate of the light source 200 shown in FIG. 2 has a first portion 172 and a second portion 174. The average distance 195 between the first portion 172 and a bottom surface 214 of the substrate 210 is less than the average distance 196 between the second surface portion 174 and the bottom surface 214 of the substrate 210. The light emitter is affixed to the first portion 172 of the top surface 212 of the substrate 210 by adhesive layer 134. The first and second conductive layers 118, 120 are located on the second portion 174 of the first surface 212 of the substrate 210. In this embodiment, only the portion of the substrate 210 proximate the light emitter 130 is thin as described above. Thus, only a small portion of the substrate 210, e.g., less than half the width as shown in the embodiment of FIG. 2, is made relatively thinner and weaker by this recessed area 170.

In the embodiment of the substrate 210 illustrated in FIG. 2, the recessed area 170 is positioned at a generally centered location on the substrate. The first conductive layer 118 may be attached to a first section 175 of the second portion 174 of the top surface 212. The second conductive layer 120 may be attached to a second section 177 of the second portion 174. The sidewalls 181, 183 of the recessed area 170 may be generally perpendicular to first portion 172.

Thus, in the embodiment of FIG. 2, light source 200 may comprise a substrate 210 made from a good thermoconductor material such as ceramic. The substrate has a relatively thin portion 220 with a light source 130 mounted directly on surface portion 172 on the relatively thin substrate portion 220 as by an adhesive layer 134 such as silver epoxy. First portion 172 may be a continuous, flat surface. The substrate has at least one relatively thick portion 222 on which at least one conductor layer 118 is formed. A terminal 143 on the light source 130 may be connected as by wire bonding 145 to the conductor layer 118. Alternatively first terminal 143 could be replaced with a bottom terminal connected to conductor layer 118 by a via, as previously described with reference to FIG. 1. A heat sink 160 may be mounted on a bottom surface 214/115 of the relatively thin portion 220 positioned opposite the first portion 172. The heat sink 160 may be positioned in alignment with the light source 130. In the illustrated embodiment, the substrate also has a second relatively thick portion 224 on which a second conductor layer 120 is formed. The second relatively thick portion 224 may be continuous with the first relatively thick portion 222 and may have the same thickness, as illustrated in FIG. 2. The greater thickness of the substrate 210 in the relatively thick portion(s) 222, 224 where the electrode(s) are provided allows the substrate 210 to have relatively greater strength in these regions, thus the substrate 210 is less likely to break during trace formation and/or wire bonding than it would be if these portions were thinner. By mounting the light emitter 130 on the substrate without an intervening metal layer, heat transfer to the substrate is improved. Heat transfer to the heat sink 160 is improved by reducing the thickness of the substrate in the portion 220 where the light emitter 130 and the heat sink 160 are mounted.

As illustrated by FIG. 2, the difference between the average thicknesses of portion 220 and portions 222 or 224 may be substantial, for example, and as shown by FIG. 2, portions 222 and 224 may be about twice as thick as portion 220.

What is claimed is:

1. A light source comprising:
   an electrically insulating substrate having a first surface, a second surface located opposite the first surface and a plurality of side surfaces located perpendicularly to the first and second surfaces;
   at least one first electrically conductive layer affixed to and partially covering the first surface, the second surface and one of the side surfaces of the substrate;
   at least one second electrically conductive layer affixed to and partially covering the first surface, the second surface and one of the side surfaces of the substrate not covered by the first electrically conductive layer;
   a light emitter affixed to the first surface of the substrate in an area not covered by either of the at least one first electrically conductive layer or the at least one second electrically conductive layer, the light emitter comprising a first terminal and a second terminal;
   a first conductor connected to the first erminal and the at least one first electrically conductive layer;
   a second conductor connected to the second terminal and the at least one second electrically conductive layer; and
   a heat sink attached to the second surface of the substrate at a location in alignment with the light emitter on the opposite side of the substrate that is not covered by either the first or second conductive layer.

2. The light source of claim 1, wherein the area of the first surface where the light emitter is affixed is continuous and flat.

3. The light source of claim 1, wherein the light emitter is a light-emitting diode.

4. The light source of claim 1, wherein the substrate comprises ceramic.

5. The light source of claim 1, wherein the light emitter is affixed directly to the substrate with a themoset material.

6. The light source of claim 1, wherein the light emitter is affixed directly to the substrate with silver epoxy.

7. The light source of claim 1, wherein a portion of the first electrically conductive layer located on the first surface is connected to another portion of the first electrically conductive layer located on the bottom surface through a via.

8. The light source of claim 1, wherein the first surface comprises a first portion and a second portion, wherein the distance between the first portion and the second surface is less than the distance between the second portion and the second surface, wherein the light emitter is located on the first portion, and wherein the at least one first electrically conductive layer is located on the second portion.

9. The light source of claim 8, wherein the light emitter is affixed to the first portion of the first surface of the substrate with adhesive.

10. The light source of claim 8, wherein the second portion comprises a first section and a second section, wherein at least a portion of the first conductive layer is attached to the first section and wherein at least a portion of the second conductive layer is attached to the second section.

11. A light source comprising:
    an electrically insulating substrate having a relatively thin portion and a relatively thick portion;
    at least a first electrode layer affixed to and at least partially covering a top surface, a bottom surface and a first sidewall of the relatively thick portion of the substrate;
    a light emitter affixed to a top surface of the relatively thin portion at a location not covered by the at least first electrode layer; and
    a heat sink affixed to a bottom surface of the relatively thin portion at a location not covered by the at least first electrode layer and aligned to the light emitter on the opposite side of the substrate;
    wherein the first electrode layer is electrically connected to a first terminal of the light emitter.

12. The light source of claim 11 comprising:
    a second electrode affixed to and at least partially covering the top surface, the bottom surface and a second sidewall of the relatively thick portion and electrically connected to a second terminal on the light emitter.

13. The light source of claim 11 wherein said the light emitter is affixed to the top surface of the thin portion of the substrate with adhesive.

14. The light source of claim 11 wherein the substrate is a ceramic substrate.

15. The light source of claim 11 wherein the light emitter is an LED.

16. The light source of claim 11, wherein the thin portion located between the heat sink and the light emitter die is configured to dissipate heat providing cooling of the light emitter.

17. A light source, comprising:
    a substrate having a recess defining the substrate into a relatively thin portion and a relatively thick portion;
    at least a first electrode layer affixed to and partially covering a top portion, a bottom portion and a sidewall of the substrate;
    a light emitter attached to the thin portion of the substrate not covered by the at least first electrode layer;
    a conductor connecting the light emitter to the at least first electrode layer; and
    a heat sink connected to the thin portion of the substrate not covered by the at least first electrode layer approximating the light emitter on the opposite side of the substrate such that the heat sink and the light emitter sandwiches the thin portion of the substrate in between.

18. The light source of claim 17, wherein the substrate is adaptable to dissipate heat.

19. The light source of claim 17, wherein the heat sink and the thin portion of the substrate are adaptable to dissipate heat.

20. The light source of claim 17 wherein the relatively thick portion has a thickness approximately two times the thin portion.

\* \* \* \* \*